United States Patent
Butt et al.

(10) Patent No.: US 8,098,073 B2
(45) Date of Patent: Jan. 17, 2012

(54) SYSTEM FOR TERMINATING HIGH SPEED INPUT/OUTPUT BUFFERS IN AN AUTOMATIC TEST EQUIPMENT ENVIRONMENT TO ENABLE EXTERNAL LOOPBACK TESTING

(75) Inventors: Derrick Sai-Tang Butt, San Leandro, CA (US); Hong-Him Lim, Cupertino, CA (US); David Carkeek, Saratoga, CA (US)

(73) Assignee: LSI Corporation, Milpitas, CA (US)

( * ) Notice: Subject to any disclaimer, the term of this patent is extended or adjusted under 35 U.S.C. 154(b) by 618 days.

(21) Appl. No.: 11/862,451

(22) Filed: Sep. 27, 2007

(65) Prior Publication Data

US 2009/0085577 A1 Apr. 2, 2009

(51) Int. Cl.
*G01R 31/02* (2006.01)
(52) U.S. Cl. ........................................ 324/537
(58) Field of Classification Search .............. None
See application file for complete search history.

(56) References Cited

U.S. PATENT DOCUMENTS

| 4,517,512 | A * | 5/1985 | Petrich et al. ............. 714/724 |
| 6,812,741 | B2 * | 11/2004 | Shibata et al. ............. 326/82 |
| 7,071,679 | B1 * | 7/2006 | Sabih et al. ............. 324/158.1 |
| 7,256,600 | B2 * | 8/2007 | Walker et al. ............. 324/763 |
| 2007/0245179 | A1 * | 10/2007 | Noda ............. 714/718 |

FOREIGN PATENT DOCUMENTS

| JP | 10170606 A * | 6/1998 |
| JP | 2003255022 A * | 9/2003 |

* cited by examiner

*Primary Examiner* — Paresh Patel
(74) *Attorney, Agent, or Firm* — Christopher P. Maiorana, PC

(57) ABSTRACT

An apparatus comprising a test termination card having a first set of connections and a second set of connections. The first set of connections may be configured to connect to a specific pinout of a device under test. The second set of connections may be configured to connect to a general pinout of a tester load board. The termination card may toggle between (a) connecting the first set of connectors to the second set of connectors to implement a first test type and (b) disconnecting the first set of connectors from the second set of connectors to implement a second test type.

17 Claims, 6 Drawing Sheets

SYSTEM FOR TERMINATING HIGH SPEED INPUT/OUTPUT BUFFERS IN AN AUTOMATIC TEST EQUIPMENT ENVIRONMENT TO ENABLE EXTERNAL LOOPBACK TESTING

FIELD OF THE INVENTION

The present invention relates to integrated circuits generally and, more particularly, to a system for terminating high speed input/output buffers in an automatic test equipment environment to enable external loopback testing.

BACKGROUND OF THE INVENTION

To ensure a high fault coverage, integrated circuits (ICs) are often tested at the speed such circuits will be used by customers (i.e., at-speed testing). Current memory interfaces, such as the DDR2 memory interface, presently run at 800 mbps. Using conventional Automated Test Equipment (ATE) approaches at such speeds would be prohibitively expensive.

One way of implementing at-speed testing is with an internal loopback. Such a system would send signals through multiplexers allowing such signals to be read back into a built-in self test (BIST) logic. Some conventional systems use an internal loopback for testing a DDR interface. Such a system also uses a multiplexer. Such a system has the disadvantage of not testing the I/O buffer at high speeds.

Current solutions implement the impedance of the transmission path by terminating the ATE pin electronics (PE) close to 50 ohms. Such termination helps with loopback testing, but does not allow for DC testing. Also, the transmission path must be properly terminated. The simplest termination is a 50-ohm resistor to ground. However, the signal has to be connected from the device under test (DUT) to the ATE PE card. In such a system two DUT boards need to be made, one with the 50-ohm termination and the other with the connection from DUT to PE card. Such a solution has the disadvantage that in a two-board system, two-pass testing must be done, approximately doubling the cost and duration of testing.

It would be desirable to implement a system that terminates I/Os by implementing a test termination card that allows both DC testing and external loopback BIST testing.

SUMMARY OF THE INVENTION

The present invention concerns an apparatus comprising a test termination card having a first set of connections and a second set of connections. The first set of connections may be configured to connect to a specific pinout of a device under test. The second set of connections may be configured to connect to a general pinout of a tester load board. The termination card may toggle between (a) connecting the first set of connectors to the second set of connectors to implement a first test type and (b) disconnecting the first set of connectors from the second set of connectors to implement a second test type.

The objects, features and advantages of the present invention include providing a testing system that may (i) provide at-speed testing, (ii) provide production test coverage (e.g., functionality, possible speed fault testing, etc.) to a core and/or I/O buffers, (iii) provide standard tests such as (a) I/O buffer standard tests to cover the I/O buffer and (b) SCAN tests to cover the digital core, (iv) implement relays as high-frequency relays, (v) provide adequate space for placement of components and/or routing of signals, (vi) enable the implementation of different termination values and/or schemes without replacing and/or redesigning the DUT board, (vii) provide high-density, high frequency connectors (e.g., backplane connectors) to free space for components and/or signal routing, (viii) implement termination resistors having a fixed value (e.g., 50-ohm, etc.), (ix) implement DPDT relays, and/or (x) provide at-speed built-in self tests that may ensure critical read/write data paths and I/O buffers are toggling at speed.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
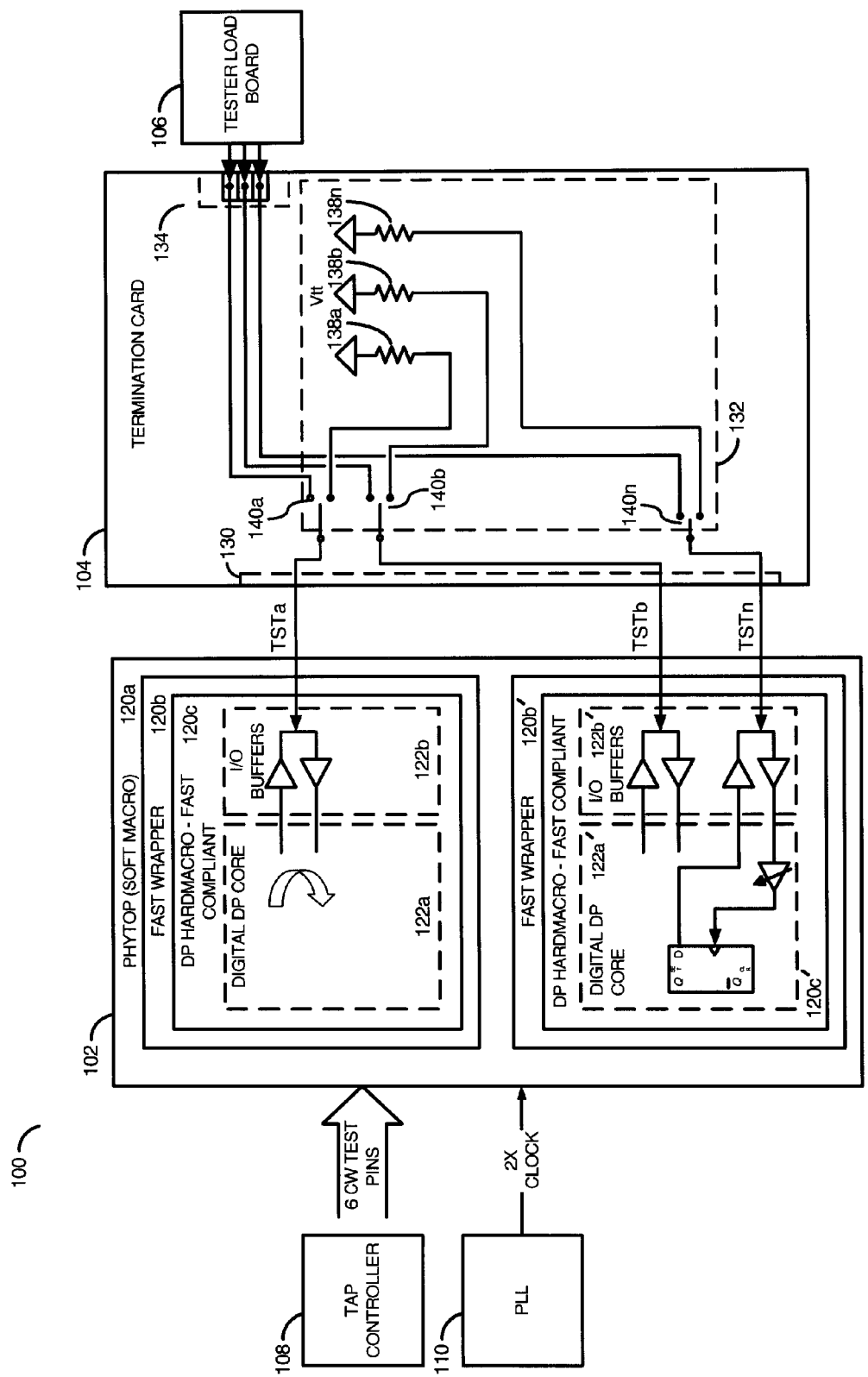
FIG. 1 is a more detailed diagram of the present invention.

Referring to FIG. 1, a diagram of a system 100 is shown in accordance with a preferred embodiment of the present invention. The system 100 generally comprises a device under test 102, a termination card 104 and a tester load board 106. The system 100 may also comprise a tap controller 108 and a phase locked loop (PLL) 110. In one example, the tap controller 108 may present a number of signals (e.g., 6 or more coreware test pins) to the device under test 102. The PLL 110 may present one or more clock signals to the device under test 102.

The device under test 102 generally comprises a section 120a, a section 120b, and a section 120c. The section 120c generally comprises a section 122a and a section 122b. The section 120a may be implemented as a PHYTOP (soft macro) section. The section 120b may be implemented as a wrapper section (e.g., a Flow for Automated Standardized Test (FAST) wrapper section). The section 120c may be implemented as a DP hard macro section (e.g., a FAST compliant wrapper section). The section 122a may be implemented as a digital DP core. The section 122b may be implemented as an I/O buffer section. The device under test 102 may also include a section 120b' and a section 120c'. The section 120b' may be implemented as a wrapper section. The section 120c' may be implemented as a DP hard macro section. The section 120c' may include a section 122a' and a section 122b'. The section 122a' may be implemented as a digital DP core section. The section 122b' may be an I/O buffer section.

In one example, the termination card 104 may be implemented as a termination board. The termination card 104 may be implemented between the device under test 102 and the tester load board 106. The termination card 104 may be implemented to toggle between a first test type and a second test type. The termination card 104 generally comprises a section 130, a section 132, and a section 134. The section 130 may provide an interface to the device under test 102. The interface 130 may provide a set of connections configured to connect to a specific pinout of the device under test 102. The section 134 may provide an interface to the tester load board 106. The interface 134 may provide a set of connections configured to connect to a general pinout of the tester load board 106. The interface 130 may present a number of signals (e.g., TSTa-n) to the section 120c and the section 120c'. The section 132 may present the signals TSTa-n from either the resistors 138a-138n or from the tester load board 106. In one example, the resistors 138a-138n may provide termination for an external loopback test. In another example, when the resistors 138a-138n are not connected, the tester load board 106 may provide a direct current test. The section 132 may include a number of relays 140a-140n. The relays 140a-140n may be configured to switch between a connection to the tester load board 106 and a connection to the resistors 138a-138n.

The termination board 104 may be a separate and/or dedicated board configured between the device under test 102 and the tester load board 106. The relays 140a-140n may be implemented as high-frequency relays. In one example, the relays 140a-140n may be implemented as double pole double throw (DPDT) relays. In one example, the resistors 138a-138n may be implemented as 50-ohm termination resistors. However, other values may be implemented to meet the design criteria of a particular implementation. The interface 130 and the interface 134 may implement high-density, high frequency connectors (e.g., backplane connectors) to free space for components and/or signal routing. The termination card 104 may provide space for placement of components and/or routing of signals. The termination card 104 may also enable the implementation of different termination values and/or schemes without replacing and/or redesigning the DUT board 106. In one example, one or more standard DUT boards 106 may be developed to be used with more than one termination board 104 and/or device under test 102. By developing multiple DUT boards 106, additional hardware cost savings may result by providing an expanded scope and/or range of testing.

The termination card 104 may allow a number of tests to be implemented. Such tests may include (i) a hardmacro test with an embedded I/O, (ii) a JTAG MUX test inside a core, and/or (iii) JTAG port tests on the CW input and output ports. Other tests may also be implemented to meet the design criteria of a particular implementation.

A scan test may be implemented to include a number of digital logic tests as described in the following table:

TABLE 1

| | DDR hardmacro (with embedded IO) pins |
|---|---|
| NAND tree | TEST_NANDTREE_IN[n:0], TEST_NANDTREE_OUT[n:0] |
| JTAG | Output group: JTAGC_TOSJOMUX[n:0], JTAGC_OMODE[n:0], JTAGC_FROMSJOMUX[n:0]<br>Enable Group: JTAGC_TOSJEMUX[n:0], JTAGC_EMODE[n:0], JTAGC_FROMSJEMUX[n:0]<br>Input Group: JTAGC_TOSJIMUX[n:0], JTAGC_IMODE[n:0], JTAGC_FROMSJIMUX[n:0]<br>Shared among I/Os: LSI_JTAGC_FD |
| Power Down | Shared among I/Os for test: TEST_CW_IO_GLOBAL_SELECT<br>Shared among I/Os for test: TEST_CW_IO_PDN, TEST_CW_IO_RPDN<br>In functional mode, PDN and RPDN of each I/O will be programmed by the phytop via the control bus<br>Add test logic/Muxes in HM to give test access |
| BZ | Shared among I/Os: BZ_EN[6:0], BZ_EP[6:0]<br>The BZ controller EN[6:0]/EP[6:0] will be driving these BZ signals.<br>For SE I/O, it is a direct connect.<br>For DIFF I/O, BZ_EN_A[6:0]/BZ_EN_B[6:0] shorted and connect to the EN[6:0], likewise for BZ_EP_A[6:0]/BZ_EP_B[6:0] to the EP[6:0].<br>No need for special test mux in the EN/EP path. |
| Misc. Test | TN[n:0], LSI_IDDTN |

The termination card 104 may provide one or more terminations through the resistors 138a-138n that may be used for at-speed tests. The particular connections may be terminated as needed to perform such at-speed tests. A FAST methodology may be used to provide (i) on chip PLL at-speed initialization, and/or (ii) automated test patterns generation through vecgen.

Figure 2:
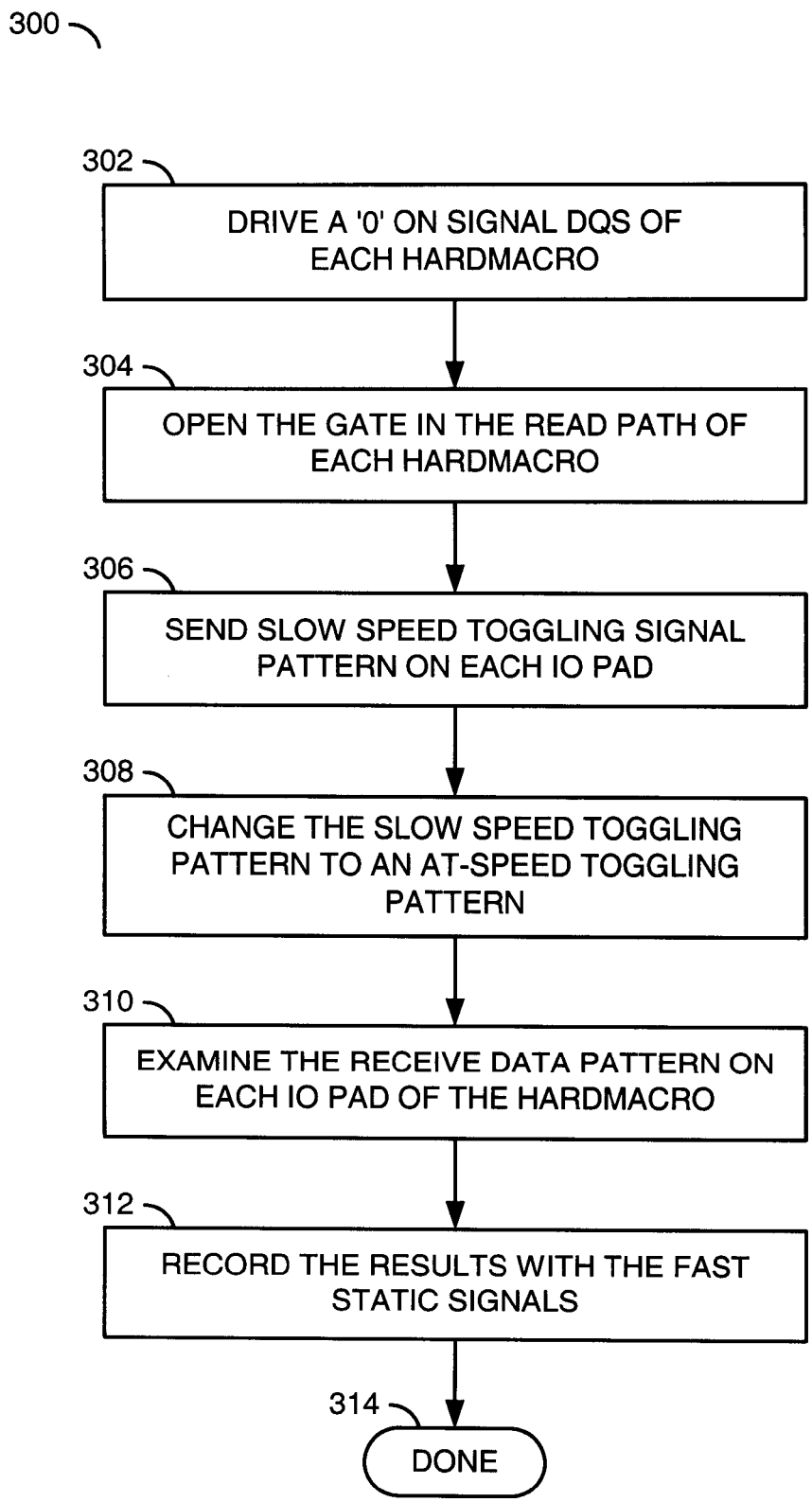
FIG. 2 is a flow diagram illustration of the operation of the invention.

Referring to FIG. 2, a flow diagram of a method 300 illustrating an example operation of BIST logic is shown. The method 300 generally comprises a step (or state) 302, a step (or state) 304, a step (or state) 306, a step (or state) 308, a step (or state) 310, a step (or state) 312, and a step (or state) 314.

The state 302 may drive a digital '0' on the signal DQS of each hardmacro. The state 304 may open the gate in the read path of each hardmacro. The state 306 may send slow speed toggling signal pattern on each I/O pad. The state 308 may change the slow speed toggling pattern to an at-speed toggling pattern. The state 310 may examine the receive data pattern on each I/O pad of the hardmacro. The state 312 may record the results with the FAST static signals. The state 314 may end the method 300.

Figure 3:
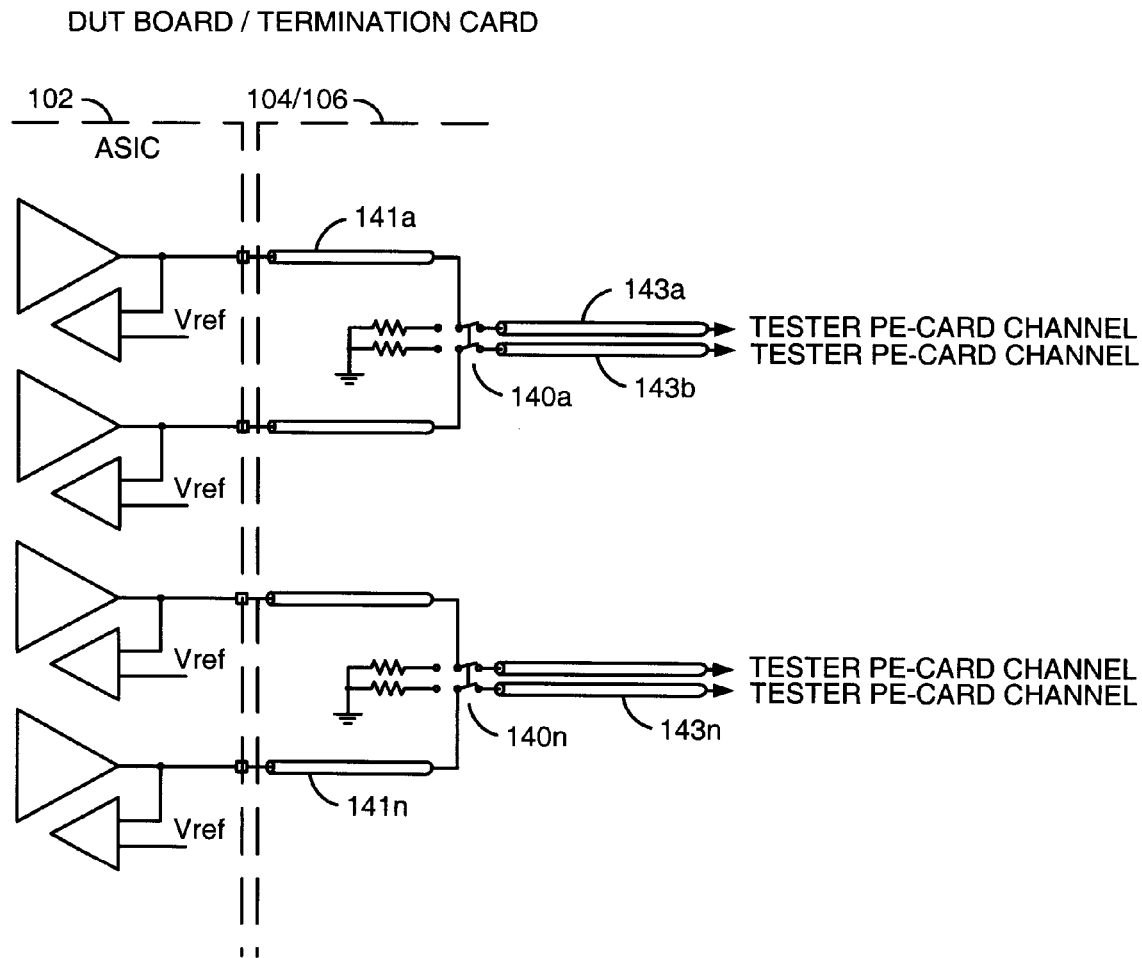
FIG. 3 is a more detailed diagram of the switching within the termination card.

Referring to FIG. 3, a more detailed diagram of the termination card 104 and the interface between the device under test 102 is shown. FIG. 3 shows a number of traces 141a-141n and a number of traces 143a-143n. The traces 141a-141n and the traces 143a-143n may be implemented as DUT board control impedance traces. The traces 143a-143n normally connect to a tester PE-card channel. The relays 140a-140n are shown in a position for normal test operation. The relays 140a-140n may be moved into the opposite position to provide termination for a BIST test. The relays 140a-140n are shown as single pole double throw (SPDT relays). However, the particular type of relay implemented for the relays 140a-140n (e.g., SPDT or DPDT) may be varied to meet the design criteria of a particular implementation. Additionally, other relays (e.g., triple pole double throw, quadruple pole double throw) may also be implemented if available for a particular implementation. Implementing DPDT relays in place of SPDT relays normally cuts the total number of relays 140a-140n needed to be implemented in half.

Figure 4:
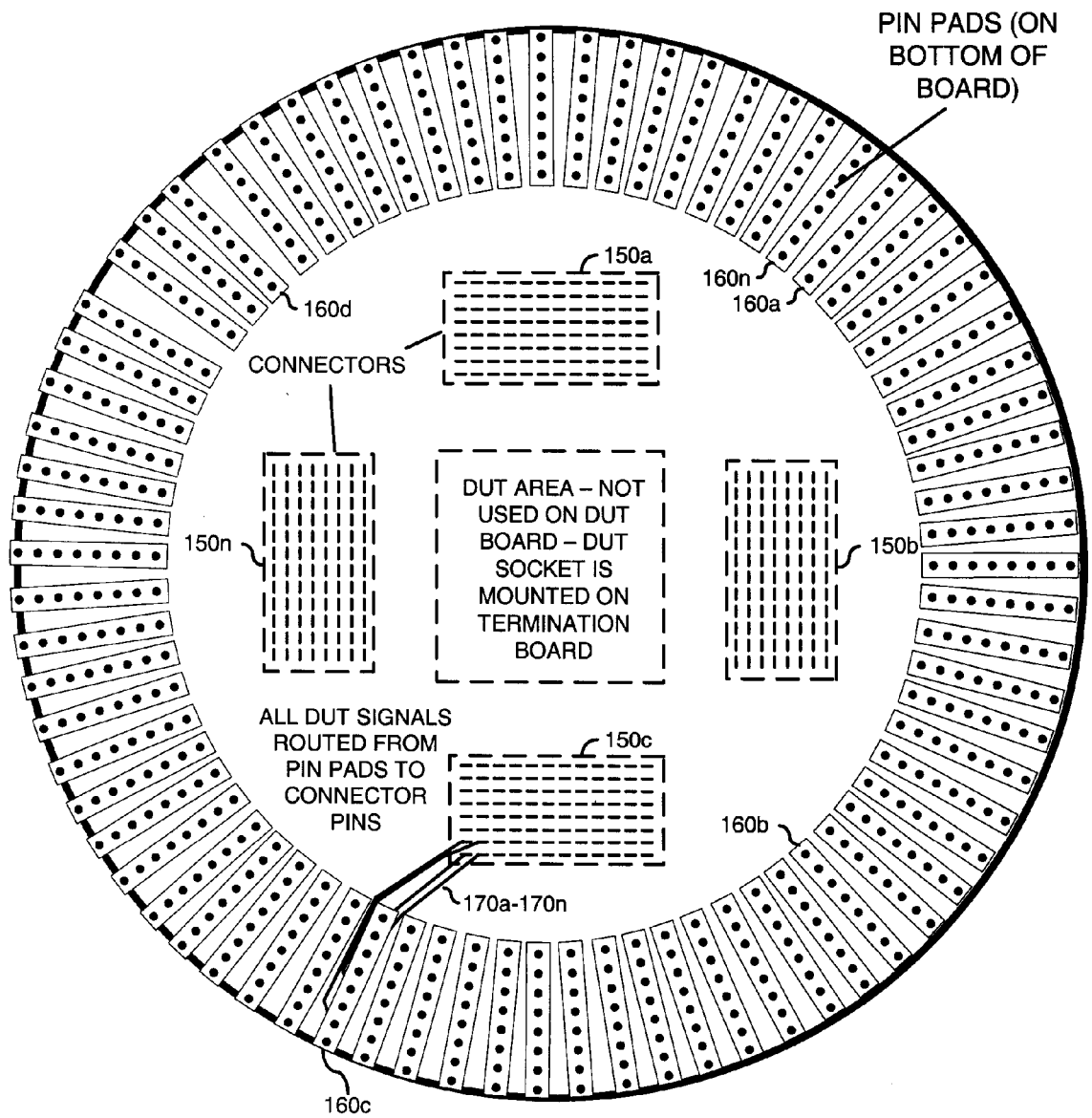
FIG. 4 is a top view of a DUT board.

Referring to FIG. 4, a top view of the DUT board 102 is shown. The DUT board 102 generally comprises a set of connectors 150a-150n, a set of pin pads 160a-160n, and a set of wires 170a-170n. The connectors 150a-150n may be implemented as part of the interface 134. In one example, the connectors 150a-150n may be implemented as mezzanine connectors. For example, the connectors 150a-150n may be implemented as NeXLev connectors available from Amphenol Company of Wallingford, Conn. However, the particular type of connector may be varied to meet the design criteria of a particular implementation.

The pin pads 160a-160n may be implemented on the bottom of the DUT board 102. The pads 160a-160n may be configured to provide pad access to the connectors 150a-150n. In one example, the pads 160a-160n may be implemented as Pogo pin pads. However, the particular type of pad may be varied to meet the design criteria of a particular implementation. The wires 170a-170n are shown connecting a particular set of pins (e.g., 160c) to a particular connector (e.g., 150c). While omitted for clarity, the DUT signals are normally routed from each of the pin pads 160a-160n to a particular one or more of the connectors 150a-150n.

The DUT board 102 normally routes signals from a number of PE cards located inside a test head to the connectors 150a-150n. A mating connector is normally installed on the back side of the termination board 104. The termination board 104 may allow additional board space to implement difficult and/or complex routing. The termination board 104 may allow flexibility when implementing and/or placing the relay 140a-140n and the termination resistor elements 138a-138n. The termination board 104 allows a high pin density in the backplane connectors 180a-180n when compared to a standard PE card signal placement. More space may be available for the relays 140a-140n, the termination resistor elements 138a-138n, trace (transmission path) routing, and/or length matching.

Figure 5:
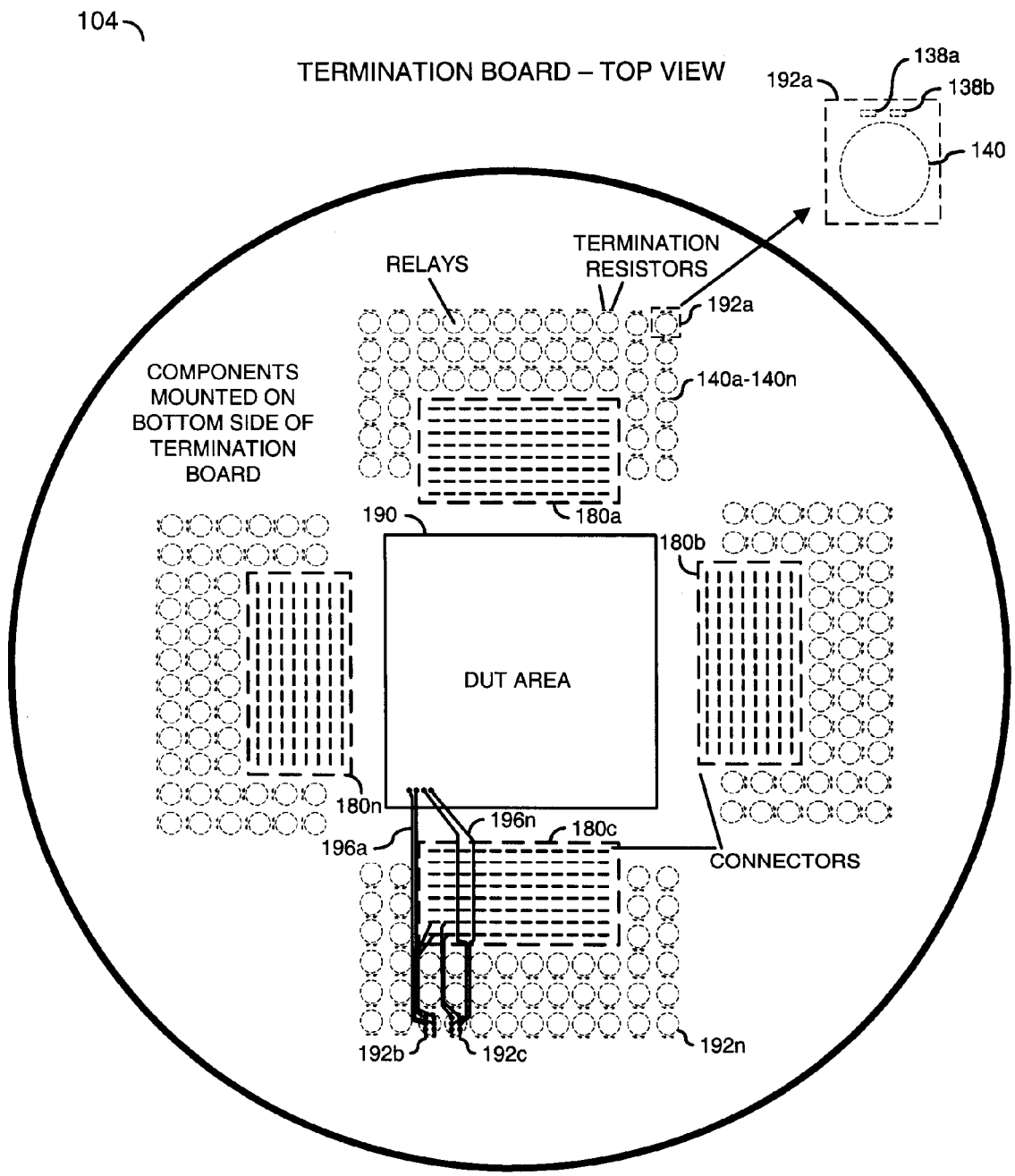
FIG. 5 is a top view of a termination board.

Referring to FIG. 5, a top view of the termination board 104 is shown. The termination board 105 generally comprises a number of connectors 180a-180n, a portion 190, and a portion 192. The connectors 180a-180n may be configured to interface with the connectors 150a-150n. In general, one side of the connectors 150a-n (or the connectors 180a-180n) may be implemented as a male connector, while the other connectors 180a-180n (or the connectors 150a-150n) may be implemented as female connectors. However, alternating gender types may be implemented. For example, the connectors 150a and 150c may be implemented as either male or female connectors, while the connectors 150b and 150n may be implemented as the opposite gender of connectors. Regardless of the configuration of each of the particular connectors 150a-150n, the corresponding connectors 180a-180n should be implemented as the opposite gender connectors. With such an implementation, the termination board normally fits on the DUT board 102 (to be described in more detail in connection with FIG. 6).

An expanded view of the portion 192a is shown as a combination of one of the relays 140a-140n and two of the termination resistors 138a and 138b. While a particular portion 192a is shown in detail, a number of the portions 192 are shown implemented around each of the connectors 180a-180n. A number of wires 196a-196n are shown connected between the DUT area and the portions 192b and 192c. Additional wires 196a-196n are normally implemented, but omitted in the figure for clarity.

Figure 6:
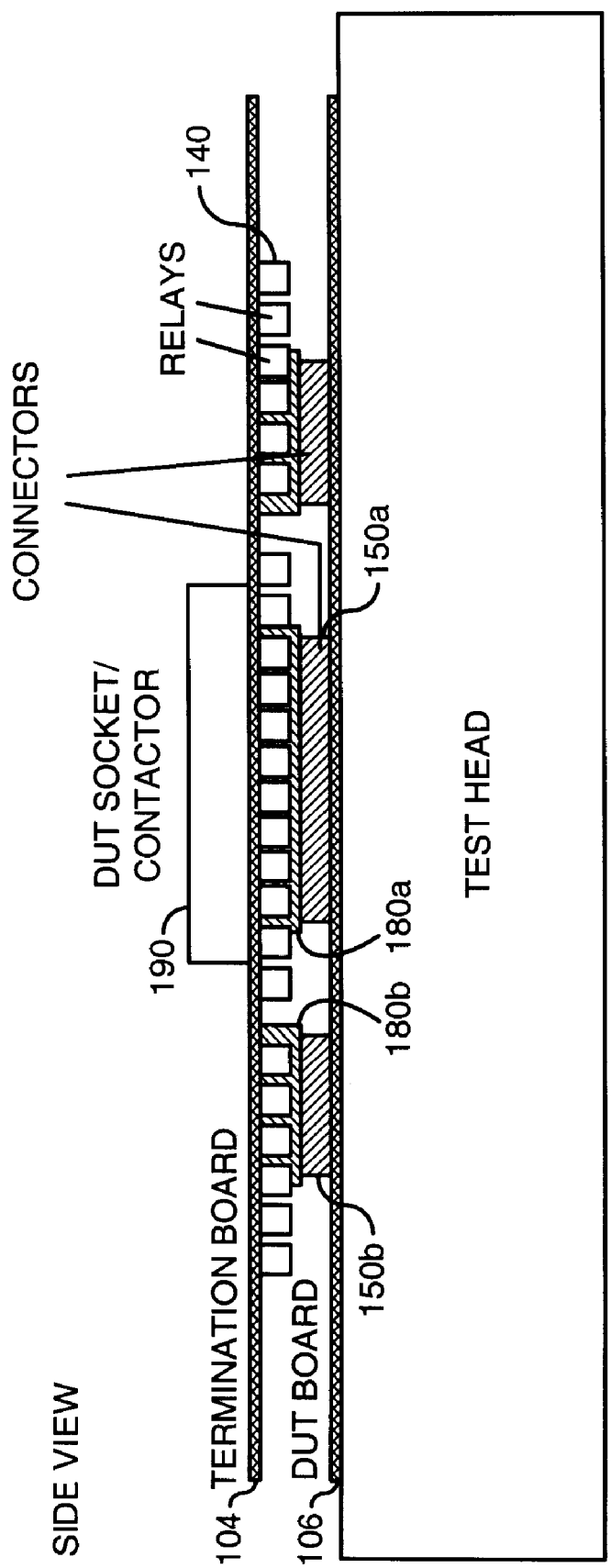
FIG. 6 is a side view of the termination board connected to a test head and a DUT socket.

Referring to FIG. 6, a side view of the termination board 104 and the DUT board 102 are shown. The side view illustrates an example of how the termination board 104 fits on top of the DUT board 102.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a test termination card having a first set of connections and a second set of connections, wherein
(i) said first set of connections are configured to connect to a first predetermined pinout of a device under test,
(ii) said second set of connections are configured to connect to a second predetermined pinout of a tester load board, and
(iii) a set of toggles configured to toggle said termination card between (a) connecting said first set of connections to said second set of connections to implement a first test type and (b) connecting said first set of connections to a set of resistors (i) located on said termination card to implement a second test type and (ii) connected to ground to provide termination.

2. The apparatus according to claim 1, wherein said set of resistors has a predetermined value used by said second test type.

3. The apparatus according to claim 2, wherein said set of resistors provide termination for a loopback test.

4. The apparatus according to claim 1, wherein (i) said first test type comprises a direct current test and (ii) said second test type comprises a loopback test.

5. The apparatus according to claim 4, wherein said first and second test types are part of an automatic test equipment environment.

6. The apparatus according to claim 1, wherein said first test type comprises two or more direct current tests.

7. The apparatus according to claim 1, wherein said first test type comprises a low-speed functional test.

8. The apparatus according to claim 1, wherein said first test type is selected from the group consisting of a DC test, two or more DC tests, a low-speed functional test, and an alternating current test.

9. The apparatus according to claim 1, wherein said second test comprises a loopback test.

10. The apparatus according to claim 9, wherein said loopback test is performed at an operating speed of said device under test.

11. An apparatus comprising:
means for implementing a test termination card having a first set of connections and a second set of connections, wherein
(i) said first set of connections connect to a first predetermined pinout of a device under test,
(ii) said second set of connections connect to a second predetermined pinout of a tester load board, and
(iii) a set of toggles configured to toggle said termination card between (a) connecting said first set of connections to said second set of connections to implement a first test type and (b) connecting said first set of connections to a set of resistors (i) located on said termination card to implement a second test type and (ii) connected to ground to provide termination.

12. A method for testing a circuit design, comprising the steps of:
 (A) implementing a test termination card having a first set of connections and a second set of connections;
 (B) connecting said first set of connections to a first predetermined pinout of a device under test;
 (C) connecting said second set of connections to a second predetermined pinout of a tester load board; and
 (D) toggling between (a) connecting said first set of connections to said second set of connections to implement a first test type and (b) connecting said first set of connections to a set of resistors (i) located on said termination card to implement a second test type and (ii) connected to ground to provide termination.

13. The method according to claim 12, wherein said set of resistors has a predetermined value used by said second test type.

14. The method according to claim 13, wherein said set of resistors provide termination for a loopback test.

15. The method according to claim 12, wherein (i) said first test type comprises a direct current test and (ii) said second test type comprises a loopback test.

16. The method according to claim 12, wherein said first test type comprises two or more direct current tests.

17. The method according to claim 12, wherein said first test type comprises a low-speed functional test.

* * * * *